United States Patent
Kao et al.

(10) Patent No.: US 7,562,196 B2
(45) Date of Patent: *Jul. 14, 2009

(54) METHOD AND APPARATUS FOR DETERMINING PRECEDENCE IN A CLASSIFICATION ENGINE

(75) Inventors: Sophia W. Kao, Cupertino, CA (US); Puneet Agarwal, Cupertino, CA (US); Frederick R. Gruner, Palo Alto, CA (US)

(73) Assignee: RMI Corporation, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/726,940

(22) Filed: Mar. 23, 2007

(65) Prior Publication Data

US 2007/0174537 A1    Jul. 26, 2007

Related U.S. Application Data

(63) Continuation of application No. 10/789,667, filed on Feb. 27, 2004, now Pat. No. 7,213,111, which is a continuation-in-part of application No. 10/735,107, filed on Dec. 12, 2003, now Pat. No. 7,234,019.

(51) Int. Cl.
*G06F 12/00* (2006.01)
*G06F 13/14* (2006.01)

(52) U.S. Cl. .............. 711/151; 711/108; 711/158; 710/244

(58) Field of Classification Search ............. 711/108, 711/151, 158; 710/244
See application file for complete search history.

(56) References Cited

U.S. PATENT DOCUMENTS 6,987,683 B2 *    1/2006    Ao ........................ 365/49

* cited by examiner

*Primary Examiner*—Hyung S Sough
*Assistant Examiner*—Mehdi Namazi
(74) *Attorney, Agent, or Firm*—Zilka-Kotab, PC

(57) ABSTRACT

A precedence determination system including a first type memory bank configured to receive a first search signal and to provide first search result indications, a second type memory bank configured to receive a second search signal and to provide second search result indications, a precedence number table coupled to the first and second type memory banks and configured to provide programmable precedence numbers, and a precedence determination circuit coupled to the first and second type memory banks and the precedence number table and configured to provide a third search result indication is disclosed. In one embodiment, the first type memory bank can be a static random access memory (SRAM) and the second type memory bank can be a ternary content addressable memory (TCAM).

22 Claims, 5 Drawing Sheets

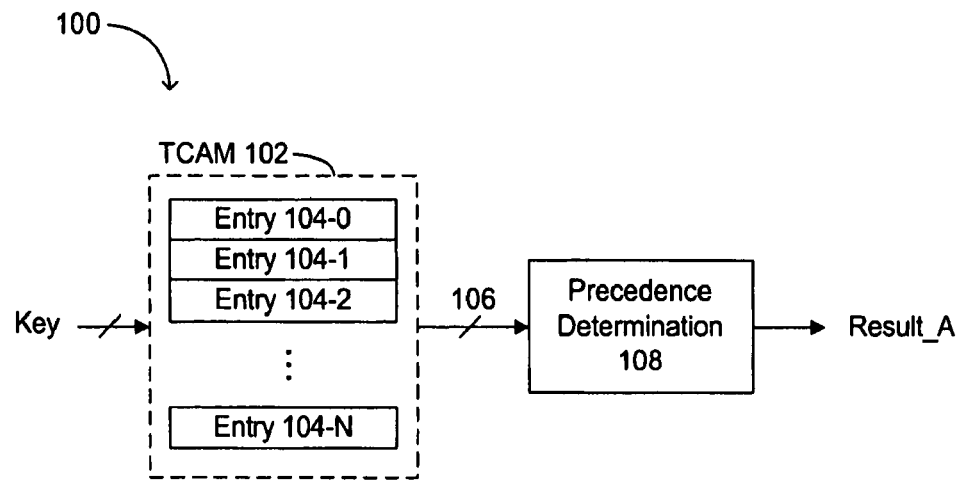
FIG. 1A (conventional)
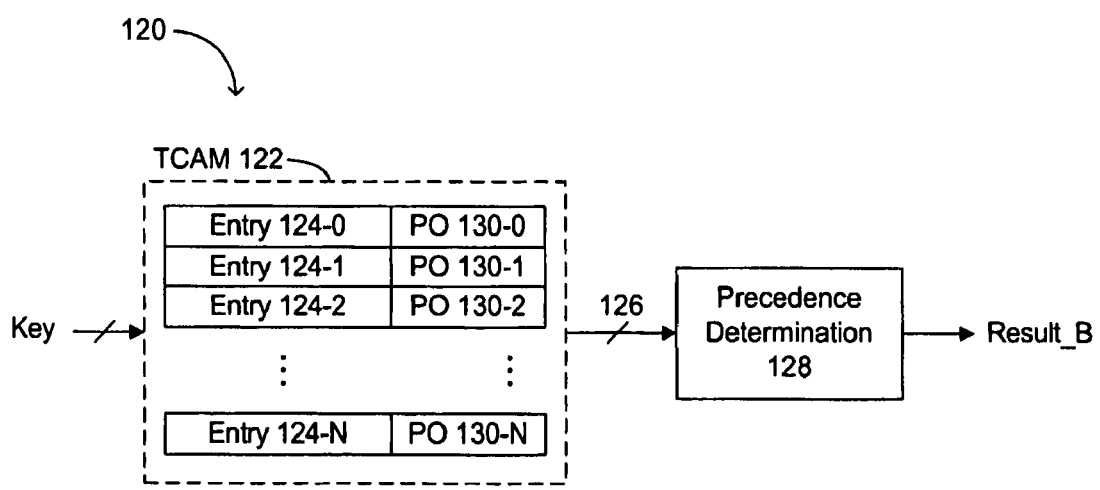
FIG. 1B (conventional)

METHOD AND APPARATUS FOR DETERMINING PRECEDENCE IN A CLASSIFICATION ENGINE

RELATED APPLICATIONS

This application is a continuation of U.S. Ser. No. 10/789,667 filed Feb. 27, 2004, now U.S. Pat. No. 7,213,111, which is a continuation in part of U.S. Ser. No. 10/735,107 filed Dec. 12, 2003, now U.S. Pat. No 7,234,019, which are incorporated herein by reference.

FIELD

The invention relates generally to the field of classification engines and, more particularly, to a method and apparatus for determining precedence in a classification engine.

BACKGROUND

In networking systems, classification engines can be used to determine an action to perform and/or a rule to apply to a particular packet. Such classification can include the use of a lookup function, which can be implemented as a hardware "search engine" or the like. Such search engines can include content addressable memory (CAM) and/or a standard memory, such as static random access memory (SRAM). The standard memory is commonly accessed using "hashing" to essentially provide a "many-to-one" function. Such an approach can allow for a smaller memory size so that overall system costs can be reduced. Further, types of CAM include "ternary" CAM, which can allow for matching one of three possible storage states: 0, 1, or "x" (i.e., a "don't care" term).

A search key applied to a search engine, such as a TCAM, can result in several "hit" or "miss" indications. If the search key is found (i.e., a "match" occurs) at multiple locations within the TCAM, a priority or "precedence" determination must be employed in order to provide an overall winner. Referring now to FIG. 1A, a block diagram of a conventional precedence determination using physical address based priority in a TCAM is shown and indicated by the general reference character 100. The search key "Key" can be applied to TCAM 102, which contains a number of entries: Entry 104-0, 104-1, 104-2, . . . Entry 104-N. If the search key matches more than one entry in TCAM 102, search result signals 106 will provide the multiple hit indications to Precedence Determination 108. Of course, this precedence determination may be integrated within the TCAM chip. In any event, the determination in this example is based purely on physical address location. For example, if Entry 104-0 and Entry 104-2 have hit indications, because the address of location 104-0 is lower than the address of 104-2, Entry 104-0 is provided as Result_A by Precedence Determination 108.

More recently, TCAM solutions have incorporated programmable priority override mechanisms to allow for increased flexibility. Referring now to FIG. I B, a block diagram of a conventional precedence determination using a programmable override based priority in a TCAM is shown and indicated by the general reference character 120. In this example, TCAM 122 contains entries: Entry 124-0, 124-1, 124-2, . . . Entry 124-N. However, each entry is also paired with a corresponding priority override: PO 130-0, 130-1, 130-2, . . . PO 130-N. Here, if the search key matches more than one entry in TCAM 122, search result signals 126 will provide the multiple hit indications to Precedence Determination 128. In this example, if Entry 124-0 and Entry 124-2 have hit indications and if PO 130-2 has a higher priority than PO 130-0, Entry 124-2 is provided as Result_B by Precedence Determination 128 due to the programmable priority override.

While the programmable priority override approach affords increased flexibility for TCAM-based solutions, classification systems having both SRAM and TCAM cannot effectively take advantage of these features. Further, while users can typically shuffle or otherwise change the priority of TCAM entries, it is a more difficult operation to perform using SRAM entries, so a software precedence approach may be more desirable for SRAM. Consequently, what is needed is a precedence determination system supporting overall programmable precedence levels that is suitable for classification systems that have both SRAM and TCAM portions.

SUMMARY

The invention overcomes the identified limitations and provides a flexible precedence determination approach suitable for classification engines in support of multiple advantageous features.

According to embodiments of the invention, a precedence determination system can include a first type memory bank configured to receive a first search signal and to provide first search result indications, a second type memory bank configured to receive a second search signal and to provide second search result indications, a precedence number table coupled to the first and second type memory banks and configured to provide programmable precedence numbers, and a precedence determination circuit coupled to the first and second type memory banks and the precedence number table and configured to provide a third search result indication. In one embodiment, the first type memory bank can be a static random access memory (SRAM) and the second type memory bank can be a ternary content addressable memory (TCAM).

According to another aspect of embodiments of the invention, a method of determining a precedence can include the steps of: (i) searching a first type memory to provide first search results; (ii) searching a second type memory to provide second search results; (iii) selecting precedence numbers from a precedence number table in response to the first and second search results; (iv) determining a precedence in response to the precedence numbers; and (v) providing a third search result. In one embodiment, the first type memory can be a static random access memory (SRAM) and the second type memory can be a ternary content addressable memory (TCAM). Further, the steps of searching the first type memory and searching the second type memory can be performed substantially in parallel.

Advantages of the invention include flexibility in providing precedence for each entry in a classification system having different types of memory, such as SRAM and TCAM.

BRIEF DESCRIPTION OF THE FIGURES

Embodiments of the invention are described with reference to the FIGS, in which:

FIG. 1A is a block diagram of a conventional precedence determination using physical address based priority in a ternary content addressable memory (TCAM);

FIG. 1B is a block diagram of a conventional precedence determination using a programmable override based priority in a TCAM;

DETAILED DESCRIPTION

Embodiments of the invention are described with reference to specific diagrams depicting system arrangements and methods. Those skilled in the art will recognize that the description is for illustration and to provide the best mode of practicing the invention. The description is not meant to be limiting. For example, reference is made to specific memory types, such as static random access memory (SRAM) and ternary content addressable memory (TCAM), but the invention is applicable to other types of memory and/or search solutions as well. Also, memory bank entries and/or arrangements thereof in a system merely provide example implementations and should not be construed as limiting. Further, while a specific number of memory banks in a system are shown, those skilled in the art will recognize that the invention is applicable to other numbers of memory banks and/or memory groupings as well.

Figure 2:
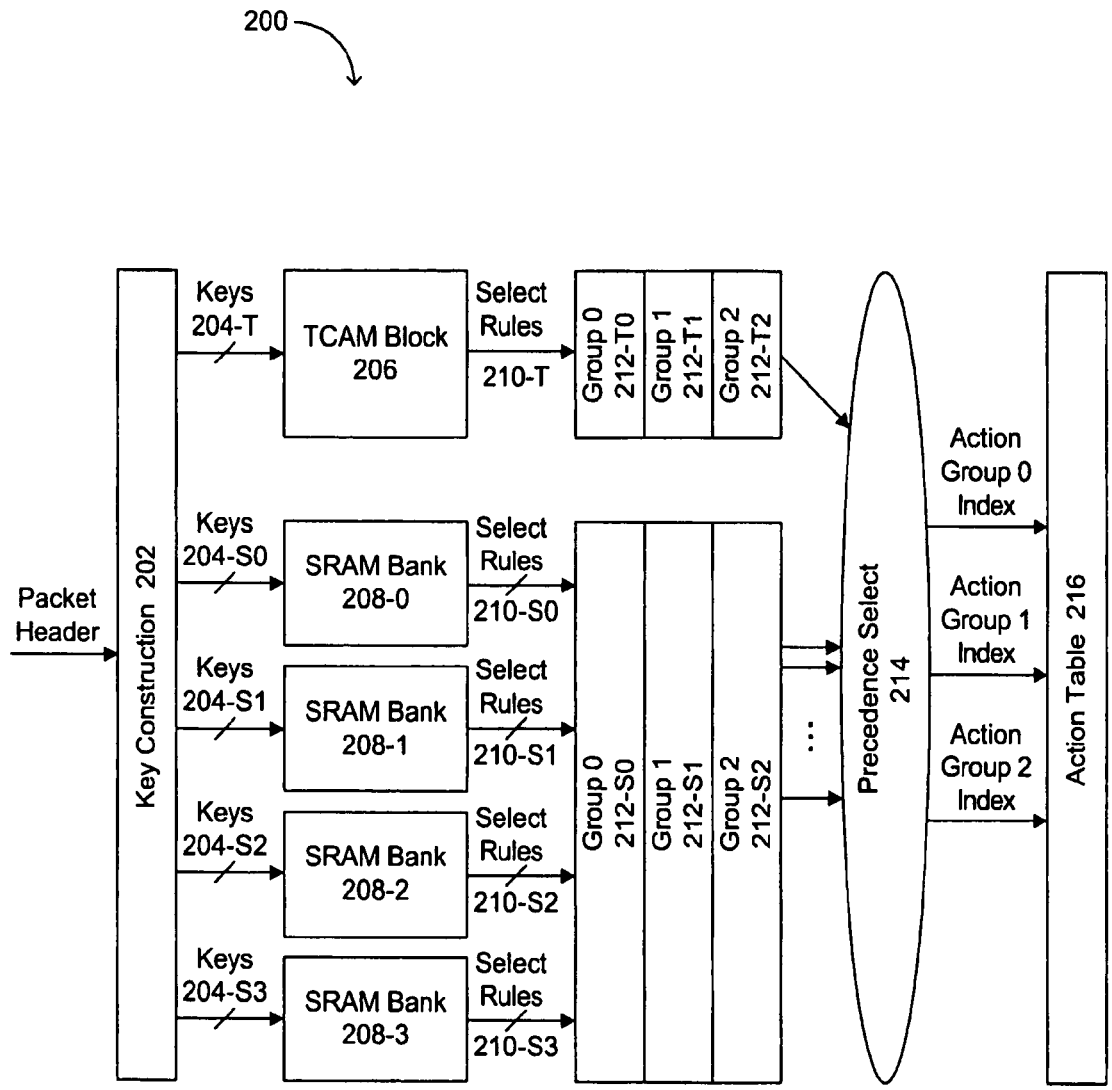
FIG. 2 is a block diagram of a classification engine according to an embodiment of the invention.

Referring now to FIG. 2, a block diagram of a classification engine according to an embodiment of the invention is shown and indicated by the general reference character 200. A Packet Header can be received by block Key Construction 202. Accordingly, the constructed keys can include information taken from a packet. For example, if an incoming packet header is up to 140 B long, 16 constructed keys of up to 256-bits each may be parsed from the packet header. The searching of these 16 constructed keys can then be done essentially in parallel fashion. Examples of types of packet headers that can be used for key construction include Internet Protocol (IP) and Media Access Control (MAC) type addresses. Further, other sources for constructed keys can include, for example, fields extracted from a packet parser, programmable offset values extracted from packet headers, predefined address fields, and/or packet profiles. Here, embodiments may provide a classification engine function whereby a packet header can be matched with a particular rule.

In FIG. 2, Key Construction 202 can provide Keys 204-T to TCAM Block 206, Keys 204-S0 to SRAM Bank 208-0, Keys 204-S1 to SRAM Bank 208-1, Keys 204-S2 to SRAM Bank 208-2, and Keys 204-S3 to SRAM Bank 208-3. Of course, the four SRAM bank and one TCAM block arrangement shown in FIG. 2 represents only one example implementation. Any number of SRAM banks and/or TCAM blocks or banks could be used in accordance with embodiments of the invention. In FIG. 2, a search result from TCAM Block 206 can include Select Rules 210-T provided to Group 0 212-T0, Group 1 212-T1, or Group 2 212-T2, depending on the group designation of the search, for example. Search results from the SRAM banks can include Select Rules 210-S0 from SRAM Bank 208-0, Select Rules 210-S1 from SRAM Bank 208-1, Select Rules 210-S2 from SRAM Bank 208-2, and Select Rules 210-S3 from SRAM Bank 208-3, for example. Each of these search results from the SRAM banks can be provided to Group 0 212-S0, Group 1 212-S1, or Group 2 212-S2, depending on the group designation of the search, for example. For each of the groups, search results including the appropriate precedence levels, can be provided to Precedence Select 214, which can determine a "winner" or overall priority hit search result for each group. Action Table 216 can receive the winning index for groups 0, 1, and 2: Action Group 0 Index, Action Group 1 Index, and Action Group 2 Index, respectively.

Figure 3:
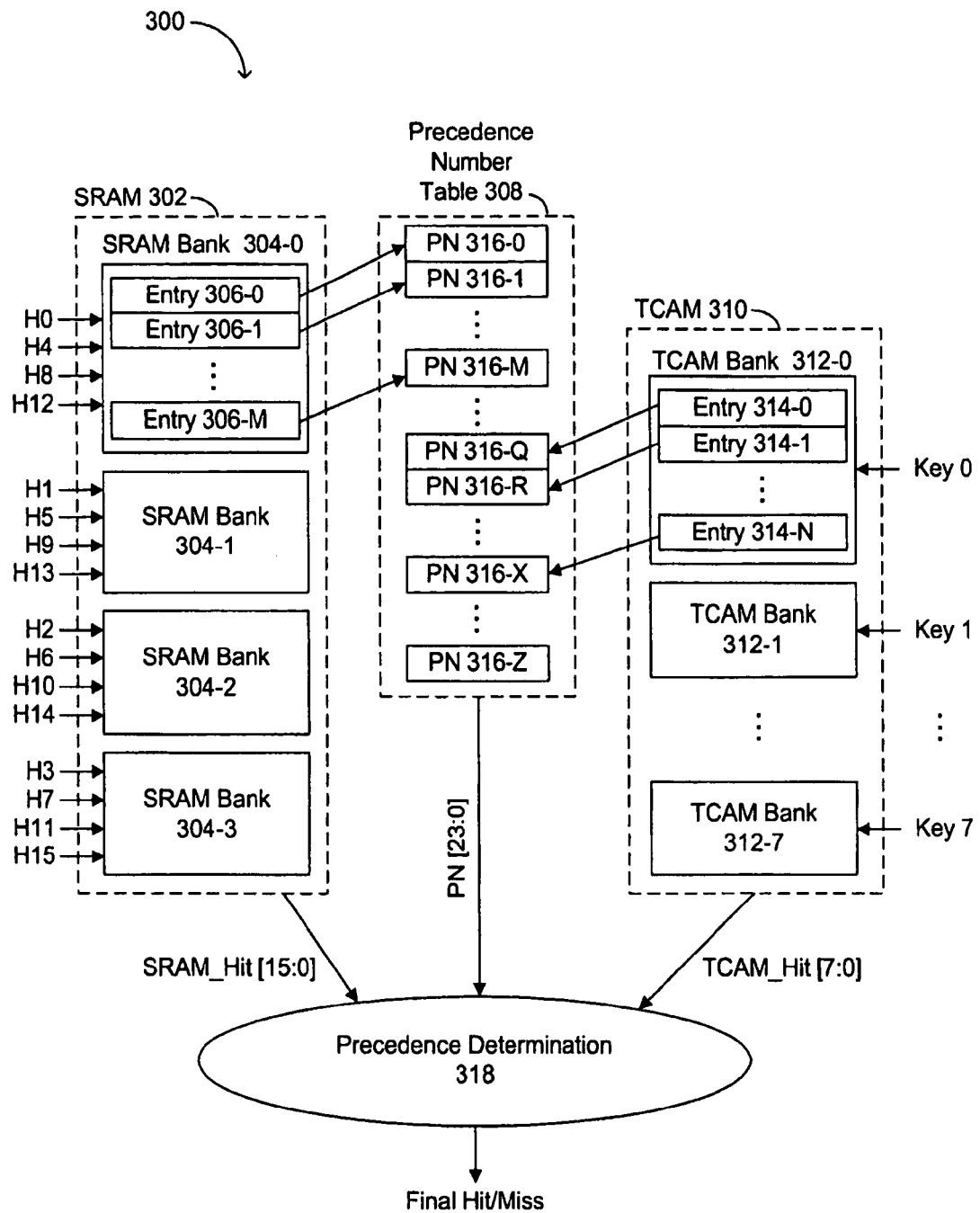
FIG. 3 is a block diagram of precedence determination system according to an embodiment of the invention.

Referring now to FIG. 3, a block diagram of precedence determination system according to an embodiment of the invention is shown and indicated by the general reference character 300. In this very particular example, SRAM 302 can include four banks: SRAM Bank 304-0, 304-1, 304-2, and SRAM Bank 304-3. Of course, more or less banks could be used in accordance with embodiments of the invention. Each of the SRAM banks can receive four hash signals, where each such signal can be generated by a Cyclic Redundancy Code (CRC) type function, for example. In this particular example arrangement, SRAM Bank 304-0 can receive hash signals H0, H4, H8, and H12, SRAM Bank 304-1 can receive hash signals H1, H5, H9, and H13, SRAM Bank 304-2 can receive hash signals H2, H6, H10, and H14, and SRAM Bank 304-3 can receive hash signals H3, H7, H11, and H15. In this fashion, four hash functions or rules can be available for each SRAM memory bank.

Each SRAM bank can be arranged as "entries," such as those shown for SRAM Bank 304-0: Entry 306-0, Entry 306-1, ... Entry 306-M. Further, each entry can correspond to a location in Precedence Number Table 308, which contains programmable precedence numbers (PN). As one example, the precedence numbers may be changed by software control means so that rules can be freely assigned. Accordingly, a user may place a precedence number associated with each rule into the precedence number table at the appropriate address. In this example, SRAM Entry 306-0 can correspond to PN 316-0, Entry 306-1 can correspond to PN 316-1, and so on through Entry 306-M corresponding to PN 316-M. In this fashion, each of the SRAM entries is configured to select one of the programmable precedence numbers.

The system can also include TCAM 310, as shown in FIG. 3. In this very particular example, TCAM 310 can include eight banks: TCAM Bank 312-0, 312-1, ... through TCAM Bank 312-7. Of course, more or less banks could be used in accordance with embodiments of the invention. Each of the TCAM banks can receive a search key: Key 0, Key 1, ... through Key 7. As one example, such search keys may be generated by a key construction block, as discussed above with reference to FIG. 2. In FIG. 3, each TCAM bank can be arranged in TCAM entries, such as those shown for TCAM Bank 312-0: Entry 314-0, Entry 314-1, ... Entry 314-N. Further, similar to the SRAM entries, each TCAM entry can also correspond to a programmable precedence number in Precedence Number Table 308. In this example, TCAM Entry 314-0 can correspond to PN 316-Q, Entry 314-1 can correspond to PN 316-R, and so on through Entry 314-N corresponding to PN 316-X. In this fashion, each of the TCAM entries is configured to select one of the programmable precedence numbers. In particular, each TCAM bank, if the search results in a match or "hit," may provide an index result of the search for that bank and then that index can be used to find the appropriate precedence number for that rule. Further, the PN values can be used to effectively choose a winner among 8 TCAM bank index results and the other 16 SRAM index results, as will be described in more detail below.

In a search according to embodiments of the invention, the hash signals and search keys can be provided to SRAM 302 and TCAM 310, respectively. The search results can include hit or miss indications that can be provided to Precedence Determination 318. For example, the SRAM portion can provide a search result for each of the applied hash signals or search operations. In this very particular example, SRAM_Hit [15:0] can provide up to 16 search "hit" results corresponding to hash signals H0-H15. Similarly, the TCAM portion can provide a search result for each of the applied search keys or search operations. In this very particular example, TCAM_Hit [7:0] can provide up to 8 search "hit" results corresponding to search keys Key 0-7. Further, each entry corresponding to a search result provided by the SRAM and/or TCAM portion can select one of PN 316-0 through PN 316-Z from Precedence Number Table 308. Accordingly, up to 24 precedence numbers can be selected and applied to Precedence Determination 318 (e.g., PN [23:0]) in this example. Of course, depending on the system arrangement, more or less precedence numbers may be selected according to embodiments of the invention.

Precedence Determination 318 can provide an overall search result or Final Hit/Miss by selecting the highest priority from among the 24 precedence numbers. Comparison of the numbers can be done in a hierarchical or other suitable fashion, for example. Any magnitude comparison circuit can be used to select the one-of-24 with the highest priority. In one embodiment, a lower magnitude PN value may correspond to a higher priority or precedence level. As an example, say Entry 306-M from the SRAM portion is among the SRAM_Hit [15:0] with a "hit" indication so that Entry 306-M has been determined to match one of H0, H4, H8, or H12. Also, say Entry 314-N from the TCAM portion is among the TCAM_Hit [7:0] with a "hit" indication so that Entry 314-N has been determined to match Key 0. Entry 306-M can then select PN 316-M and Entry 314-N can select PN 316-X so that PN 316-M and PN 316-X can be provided to Precedence Determination 318 via signals PN [23:0]. In order to decide the winning hit from among these two entries, the corresponding PN values can be compared. Thus, if PN 316-M is programmed as "0001100" while PN 316-X is programmed as "0001101" Precedence Determination 318 may choose PN 316-M as the lower magnitude PN value, which can correspond to the higher priority or precedence level. Accordingly, Entry 306-M from the SRAM portion may be provided as a Final Hit/Miss indication. Of course, the number of bits in the precedence number may vary depending on the particular system arrangement. In one embodiment, a 14-bit value is used in a data structure supporting up to 10K rules.

Figure 4:
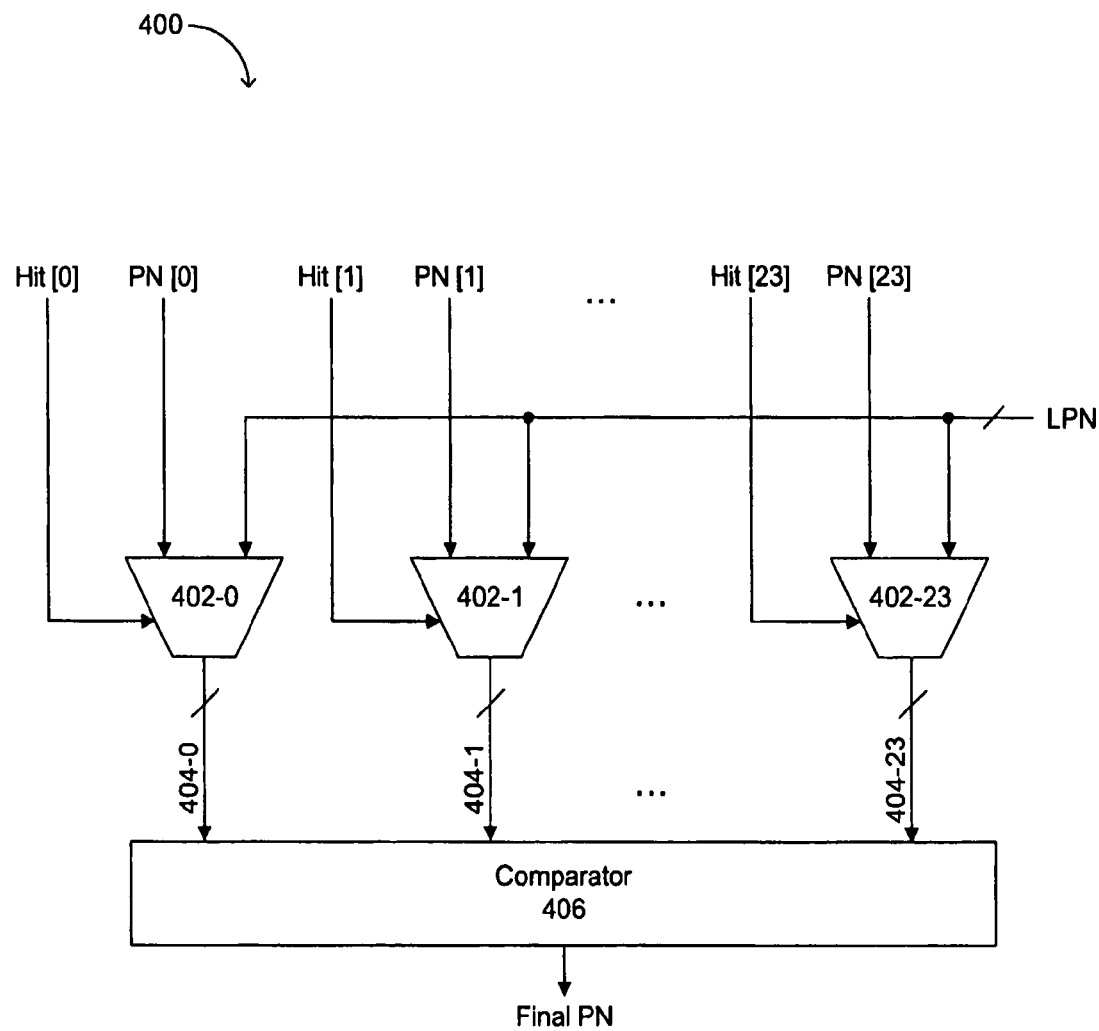
FIG. 4 is a diagram of a precedence determination function implementation according to an embodiment of the invention.

Referring now to FIG. 4, a diagram of a precedence determination function implementation according to an embodiment of the invention is shown and indicated by the general reference character 400. In particular, handling of a "miss" condition, including the use of a Lowest Precedence Number (LPN) default precedence value will be discussed. The implementation of FIG. 4 may be one example implementation for Precedence Determination 318 of FIG. 3, for example. In FIG. 4, each of the hit indications, including those from both SRAM and TCAM memory banks, can be received as Hit [0], Hit [1], . . . Hit [23]. Each hit indication Hit [0] through Hit [23] can control an associated multiplexer 402-0, 402-1, . . . 402-23. Multiplexer 402-0 can receive as inputs PN [0] and LPN with Hit [0] as a control signal. Similarly, Multiplexer 402-1 can receive as inputs PN [1] and LPN with Hit [1] as a control signal, and so on through Multiplexer 402-23 receiving inputs PN [23] and LPN with Hit [23] as a control signal. Accordingly, each multiplexer can be controlled by the associated hit indication and the "PN" path can be selected for a "hit" condition while the "LPN" path can be selected for a "miss" condition. For example, if Hit [0]="0" to indicate a miss condition, LPN can pass through multiplexer 402-0 to signals 404-0. As another example, if Hit [1]="1" to indicate a hit condition, PN [1] can pass through multiplexer 402-1 to signals 404-1. In similar fashion, each multiplexer through 402-23 can provide associated signals through 404-23, for example. Each of signals 404-0, 404-1, through 404-23 can connect to Comparator 406. In this fashion, LPN can provide a default precedence value to Comparator 406 so that the comparator can perform a designated magnitude comparison, for example. Accordingly, if none of Hit [0], Hit [1], through Hit [23] are hits, but rather all are miss conditions, LPN, the default precedence value, can be output as Final PN.

Figure 5:
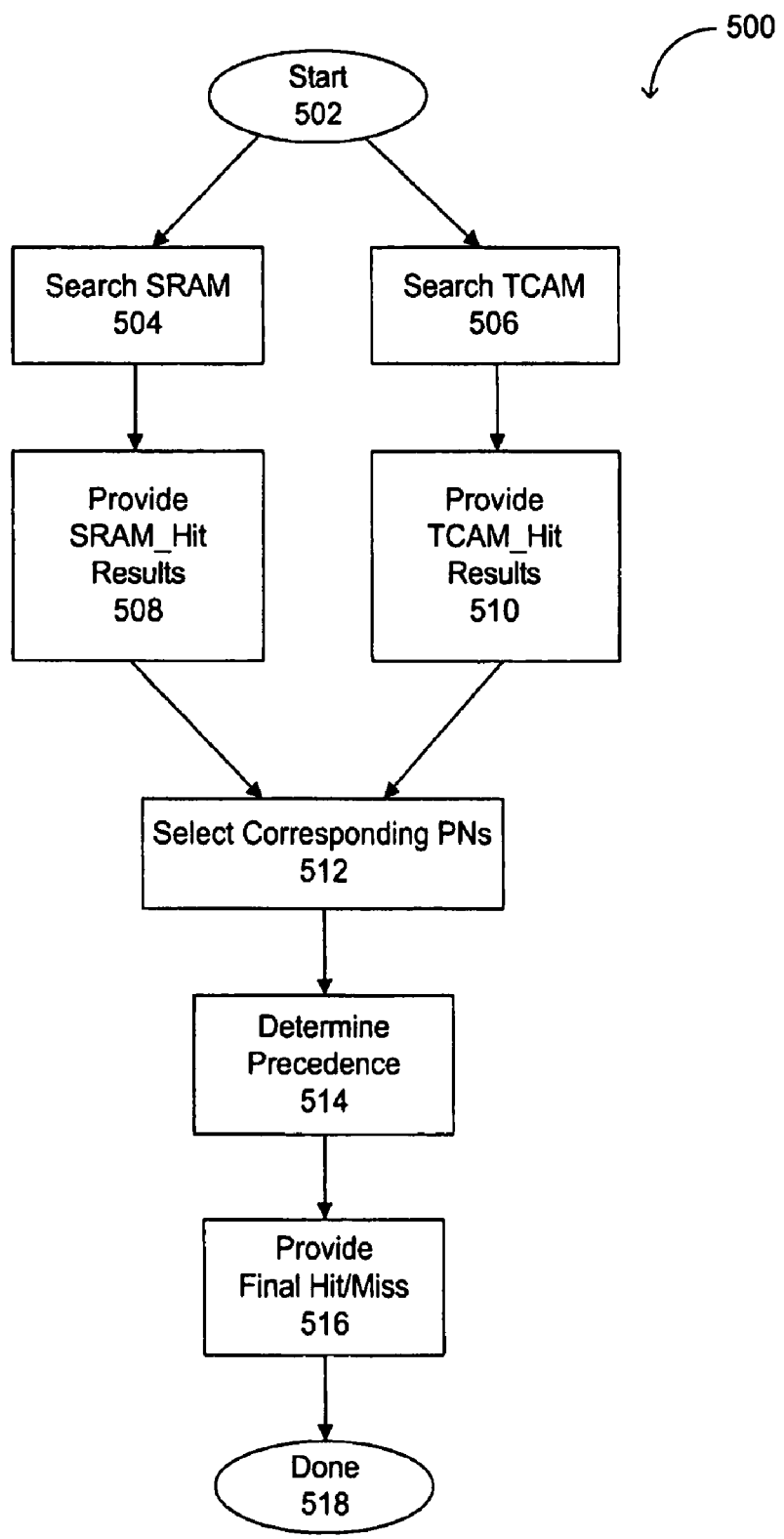
FIG. 5 is a flow diagram of a method of determining precedence according to embodiments of the invention.

Referring now to FIG. 5, a flow diagram of a method of determining precedence according to embodiments of the invention is shown and indicated by the general reference character 500. The flow can begin in Start 502. Searches on SRAM and TCAM portions can occur substantially in parallel or in a serial type fashion. In the particular example shown in FIG. 5, Search SRAM 504 and Search TCAM 506 can proceed substantially in parallel. From Search SRAM 504, the flow can proceed to step Provide SRAM_Hit Results 508. Similarly, from Search TCAM 506, the flow can proceed to step Provide TCAM_Hit Results 510. Further, both the SRAM and the TCAM portions can Select Corresponding PNs 512. This step can include selecting an appropriate programmable precedence number (PN) for each search result from the precedence number table. Next, the flow can proceed to step Determine Precedence 514. In this step, the winning hit can be determined by, for example, comparing the magnitudes of the selected precedence numbers, as discussed above. Next, the flow can proceed to Provide Final Hit/Miss 516. The flow can end in Done 518.

Advantages of the invention include flexibility in providing precedence for each entry in a classification system having different types of memory, such as SRAM and TCAM.

Having disclosed exemplary embodiments and the best mode, modifications and variations may be made to the disclosed embodiments while remaining within the subject and spirit of the invention as defined by the following claims.

The invention claimed is:

1. A precedence determination system, comprising:
a precedence number table coupled to first and second type memory banks and providing a plurality of programmable precedence numbers; and
a precedence determination circuit coupled to the first and second type memory banks and the precedence number table and providing a search result indication.

2. The precedence determination system of claim 1, wherein;
the first type memory bank includes static random access memory (SRAM).

3. The precedence determination system of claim 1, wherein:
the second type memory bank includes ternary content addressable memory (TCAM).

4. The precedence determination system of claim 2, wherein:
the first type memory bank includes a plurality of entries.

5. The precedence determination system of claim 3, wherein:
the first type memory bank includes a plurality of entries.

6. The precedence determination system of claim 1, wherein:
a search signal received by the first type memory bank includes a hash function signal 7. The precedence determination system of claim 1, wherein:
a search signal received by the second type memory bank includes a search key.

8. The precedence determination system of claim 4, wherein:

each of the plurality of entries is configured to select one of the plurality of programmable precedence numbers.

9. The precedence determination system of claim 5, wherein:
each of the plurality of entries is configured to select one of the plurality of programmable precedence numbers.

10. The precedence determination system of claim 6, wherein:
each of a plurality of search result indications provided by the first type memory bank includes a hit or miss indication in response to the hash function .signal.

11. The precedence determination system of claim 7, wherein:
each of a plurality of search result indications provided by the second type memory bank includes at most one hit indication in response to the search key.

12. The precedence determination system of claim 11, wherein:
the at most one hit indication is provided in response to a physical address based precedence.

13. The precedence determination system of claim 1, wherein:
the search result indication includes an overall hit or miss indication.

14. The precedence determination system of claim 13, wherein:
the overall miss indication includes a default precedence value.

15. A method of determining a precedence, comprising:
providing at least one first search result;
providing at least one second search result;
selecting a plurality of precedence numbers from a precedence number table in response to the first and second search result;
determining a precedence in response to the plurality of precedence numbers; and
providing a third search result.

16. The method of determining the precedence of claim 15, wherein:
a first type memory searched to provide the at least one first search result includes static random access memory (SRAM).

17. The method of determining the precedence of claim 16, wherein:
a second type memory searched to provide at least one second search result includes ternary content addressable memory (TCAM).

18. The method of determining the precedence of claim 15, further comprising:
searching a first type memory and searching a second type memory substantially in parallel.

19. The method of determining the precedence of claim 15, wherein:
the third search result includes an overall hit or miss indication.

20. The method of determining the precedence of claim 19, wherein:
the overall miss indication includes a default precedence value.

21. The method of determining the precedence of claim 15, wherein:
the plurality of precedence numbers are programmable.

22. An apparatus for determining a precedence, comprising:
a means for providing at least one first search result;
a means for providing at least one second search result;
a means for selecting a plurality of precedence numbers from a precedence number table in response to the first and second search result;
a means for determining a precedence in response to the plurality of precedence numbers; and
a means for providing a third search result.

* * * * *